United States Patent [19]

Uriya

[11] Patent Number: 5,502,417
[45] Date of Patent: Mar. 26, 1996

[54] INPUT AMPLIFIER CIRCUIT

[75] Inventor: Susumu Uriya, Tokyo, Japan

[73] Assignee: NEC Corporation, Tokyo, Japan

[21] Appl. No.: 165,931

[22] Filed: Dec. 14, 1993

[30] Foreign Application Priority Data

Dec. 28, 1992 [JP] Japan ................... 4-359826

[51] Int. Cl.⁶ .................................... H03F 1/30
[52] U.S. Cl. ................ 327/541; 327/391; 327/544
[58] Field of Search ..................... 307/264, 576,
307/585, 540, 546, 548, 272.2, 451, 452,
443, 290, 490, 296.3

[56] References Cited

U.S. PATENT DOCUMENTS

| | | | |
|---|---|---|---|
| 3,812,384 | 5/1974 | Skorup | 307/279 |
| 4,568,842 | 2/1986 | Koike | 307/585 |
| 4,950,926 | 8/1990 | Isobe et al. | 307/585 |
| 4,963,769 | 10/1990 | Hiltpold et al. | 307/296.3 |
| 5,115,150 | 5/1992 | Ludwig | 307/452 |
| 5,311,070 | 5/1994 | Dooley | 307/585 |

FOREIGN PATENT DOCUMENTS

| | | |
|---|---|---|
| 0150606 | 8/1985 | European Pat. Off. . |
| 0228875 | 7/1987 | European Pat. Off. . |
| 59-156007 | 9/1984 | Japan . |
| 62-26910 | 2/1987 | Japan . |
| 2-63306 | 3/1990 | Japan . |

*Primary Examiner*—Timothy P. Callahan
*Assistant Examiner*—My-Trang Nu Ton
*Attorney, Agent, or Firm*—Young & Thompson

[57] ABSTRACT

An input amplifier circuit including a gate circuit for amplifying such as a NAND circuit or a NOR circuit, in which a signal to be amplified is input from a first input terminal and an operating state or an inoperative state is selected by an enable signal input to a second input terminal, and a switch circuit including a resistance part, which is connected between the first input terminal and the output terminal of the NOR circuit and is controlled by the enable signal. A first MOS transistor is connected between a direct current power source and the first input terminal and is controlled by the enable signal and a second MOS transistor is connected between the first input terminal and ground and is controlled by the enable signal. Hence, a time required for raising from the inoperative state up to the operating state is reduced.

7 Claims, 5 Drawing Sheets

5,502,417

INPUT AMPLIFIER CIRCUIT

BACKGROUND OF THE INVENTION

1. Field of the Invention

The present invention relates to an input amplifier circuit used for a portable telephone or the like, and more particularly to an input amplifier circuit using a CMOSFET.

2. Description of the Related Art

In FIG. 1, there is shown a conventional input amplifier circuit of this kind. As shown in FIG. 1, a signal source 15 is connected to an input terminal IN1 via a capacitor C1 and the input terminal IN1 is coupled with one input terminal of a NAND circuit 12 which constitutes a part of the input amplifier circuit 11. An enable terminal IN2 is coupled with another input terminal of the NAND circuit 12. An output terminal of the NAND circuit 12 is connected to an output terminal OUT and one input terminal of the NAND circuit 12 via a switch circuit 18 which is constituted by an N-channel MOS transistor M8 and a P-channel MOS transistor M4. Also, a P-channel MOS transistor MS1 is connected between a DC power source VDD and one input terminal of the NAND circuit 12 and an N-channel MOS transistor M52 is connected between one input terminal of the NAND circuit 12 and ground.

In this input amplifier circuit, as described above, one input terminal of the NAND circuit 12 whose output is fed back from its output terminal to its one input terminal via the switch circuit 18 is connected to the input terminal IN1 and another input terminal of the NAND circuit 12 is coupled with the enable terminal IN2. In this case, by a control signal such as an enable signal EN input to the enable terminal IN2, the input amplifier circuit 11 can be switched from an operating state to an unoperating state.

Further, both the P-channel MOS transistor MS1 and the N-channel MOS transistor M52 are used in off state, and by designing the sizes of the P-channel MOS transistor MS1 and the N-channel MOS transistor M52 to be large, the NAND circuit 12 can be protected from static electricity.

In order to make the input amplifier circuit 11 to assumes the operating state, an enable signal EN of a high level is applied to the enable terminal IN2. At this time, in the input amplifier circuit 11, a self-bias is given to the input terminal IN1 by the N-channel MOS transistor M3 and the P-channel MOS transistor M4 and an input signal is applied from the signal source 15 to this self-bias point via the capacitor C1. Hence, an amplified input signal is taken out from the output terminal of the NAND circuit 12, that is, the output terminal OUT of the input amplifier circuit 11.

On the other hand, when the enable signal EN is a low level, the output of the NAND circuit 12 is forced to be a high level and thus the input amplifier circuit 11 assumes the unoperating state.

In the conventional input amplifier circuit described above, when it is in the unoperating state by applying the enable signal EN of the low level to the enable terminal IN2, the input terminal IN1 is a high level. When the input amplifier circuit 11 is changed from the unoperating state to the operating state by changing the enable signal EN to the high level, the self-bias is given from the output terminal of the NAND circuit 12 to the input terminal IN1 via a resistance part of the switch circuit 13 and the voltage is finally stabilized at near a middle point.

However, in order to stabilize the voltage near the middle point on the input terminal IN1 to operate as the input amplifier circuit, a time constant decided by a coupling capacitor due to the resistance part of the switch circuit 13 and the capacitor C1 affects and hence it takes a certain time until the input amplifier circuit 11 becomes the operating state, as shown in FIG. 2. In FIG. 2, T1 represents a rise time and T2 represents an operating period as an input amplifier circuit. Also, in FIG. 2, to indicates a timing for switching the enable signal EN from the low level to the high level.

Therefore, in case of an intermittent use or the like of the input amplifier circuit 11, it is necessary to raise the enable signal EN on the enable terminal IN2 from a fairly early time thus resulting in a significant increase in the power consumed.

Accordingly, in order to reduce the time for making the input amplifier circuit 11 assume the operating state, it is considered to reduce the resistance part of the switch circuit 13. However, in this case, on the contrary, a gain as the input amplifier circuit lowers and a stable operation can not be obtained.

SUMMARY OF THE INVENTION

Accordingly, it is an object of the present invention to provide an input amplifier circuit in view of the aforementioned defects of the prior art, which is capable of reducing a rise time up to an operating state.

In accordance with one aspect of the present invention, there is provided an input amplifier circuit, comprising a gate circuit for amplification, the gate circuit having first and second input terminals and an output terminal, in which a signal to be amplified is input to the first input terminal and either an operating state or an unoperating state is selected by an enable signal input to the second input terminal; a switch circuit including a resistance part, which is controlled by the enable signal and is connected between the first input terminal and the output terminal of the gate circuit; a first MOS transistor which is connected between a direct current power source and the first input terminal of the gate circuit and is controlled by the enable signal; and a second MOS transistor which is connected between the first input terminal of the gate circuit and ground and is controlled by the enable signal.

In accordance with another aspect of the present invention, there is provided an input amplifier circuit, comprising a NAND circuit for amplification, the NAND circuit having first and second input terminals and an output terminal, in which a signal to be amplified is input to the first input terminal and either an operating state or an unoperating state is selected by an enable signal input to the second input terminal; a switch circuit including a resistance part, which is controlled by the enable signal and is connected between the first input terminal and the output terminal of the NAND circuit; a first MOS transistor which is connected between a direct current power source and the first input terminal of the NAND circuit and is controlled by the enable signal; and a second MOS transistor which is connected between the first input terminal of the NAND circuit and ground and is controlled by the enable signal.

In accordance with a further aspect of the present invention, there is provided an input amplifier circuit, comprising a NOR circuit for amplification, the NOR circuit having first and second input terminals and an output terminal, in which a signal to be amplified is input to the first input terminal and either an operating state or an unoperating state is selected by an enable signal input to the second input terminal; a switch circuit including a resistance part, which is controlled by the enable signal and is connected between the first input terminal and the output terminal of the NOR circuit; a first MOS transistor which is connected between a direct current power source and the first input terminal of the NOR circuit and is controlled by the enable signal; and a second MOS transistor which is connected between the first input terminal of the NOR circuit and ground and is controlled by the enable signal.

In a preferable input amplifier circuit, at least one MOS transistor which is connected between the first MOS transistor and the first input terminal of the gate circuit, the NAND circuit or the NOR circuit is controlled by the enable signal and at least one MOS transistor which is connected between the second MOS transistor and the first input terminal of the gate circuit, the NAND circuit or the NOR circuit is controlled by the enable signal.

In another preferable input amplifier circuit, the switch circuit includes a plurality of MOS transistors controlled by the enable signal.

In the above-described constructions of the present invention, when the gate circuit for amplification, the NAND circuit or the NOR circuit is in the unoperating state by the enable signal, by switching on the MOS transistors connected between the direct current power source and the first input terminal of the gate circuit for amplification, the NAND circuit or the NOR circuit and between the first input terminal of the same and the ground, a bias voltage partially pressurized by the first and second MOS transistors can be previously applied to the first input terminal of the gate circuit for amplification, the NAND circuit or the NOR circuit in the unoperating state.

Hence, by the switching the level of the enable signal, the time required for raising the gate circuit for amplification, the NAND circuit or the NOR circuit up to the operating state can be reduced.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1:
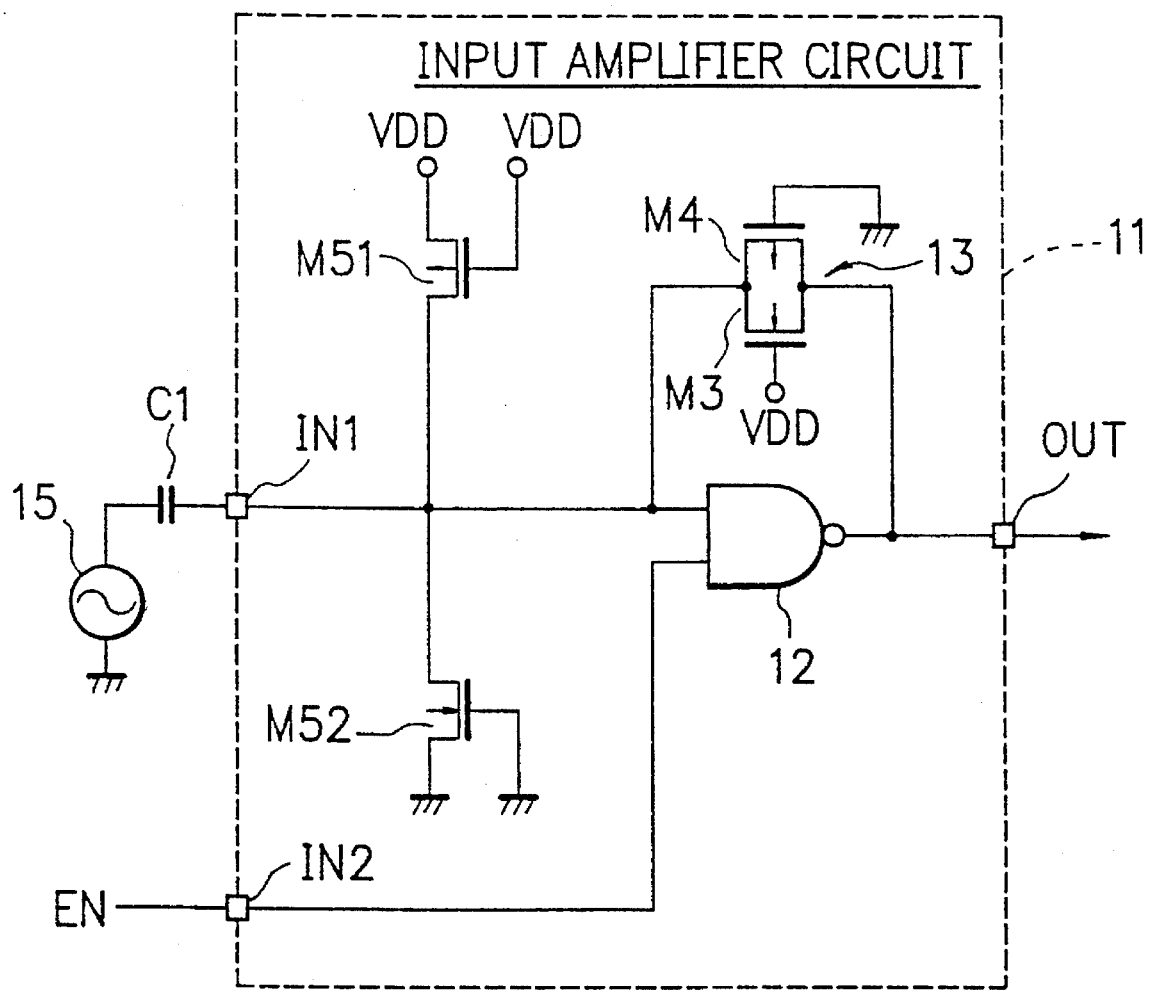
FIG. 1 is a circuit diagram of a conventional input amplifier circuit.
Figure 2:
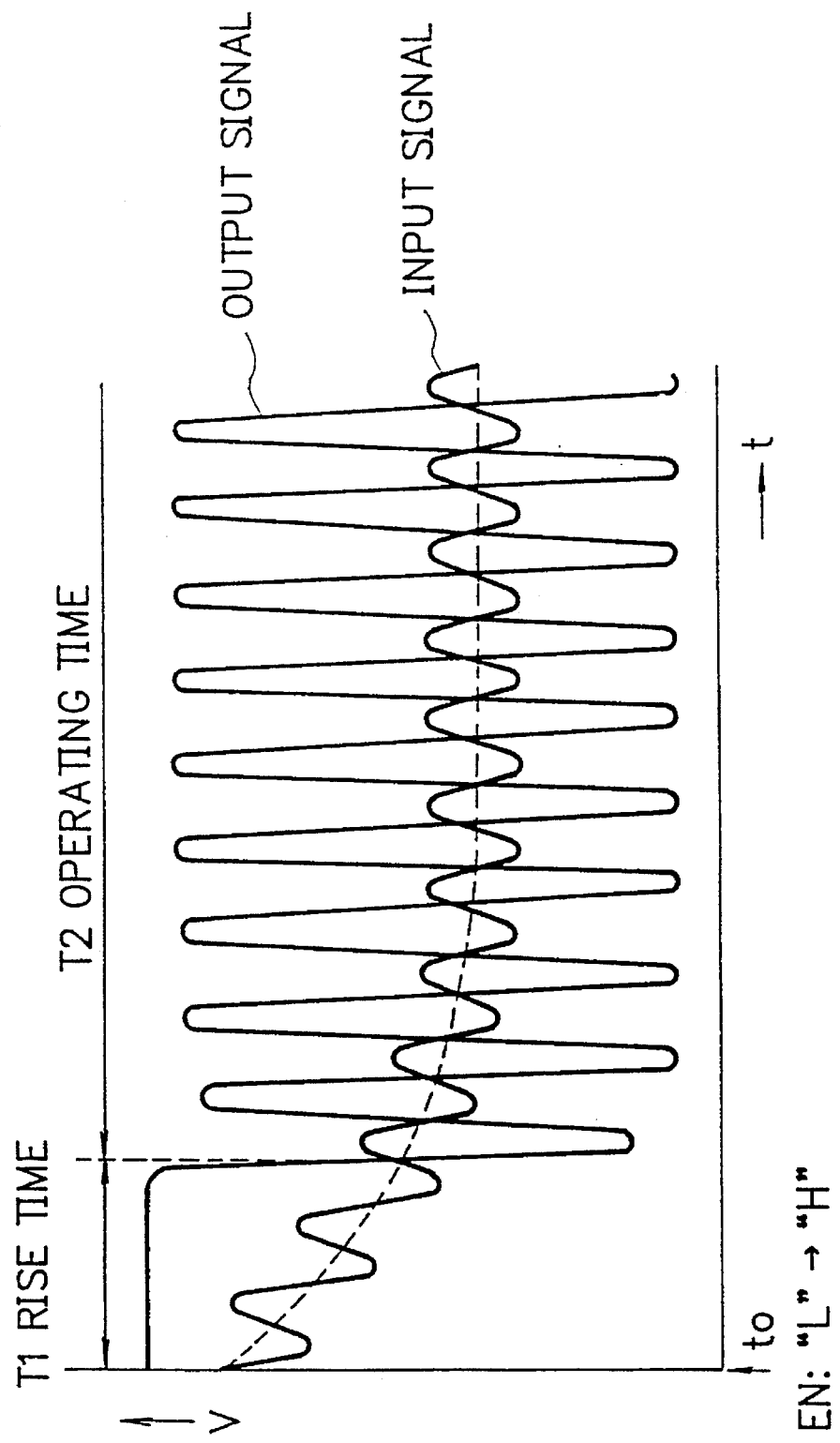
FIG. 2 is a graphical representation showing input and output waveforms for explaining an operation of the input amplifier circuit shown in FIG. 1.
Figure 3:
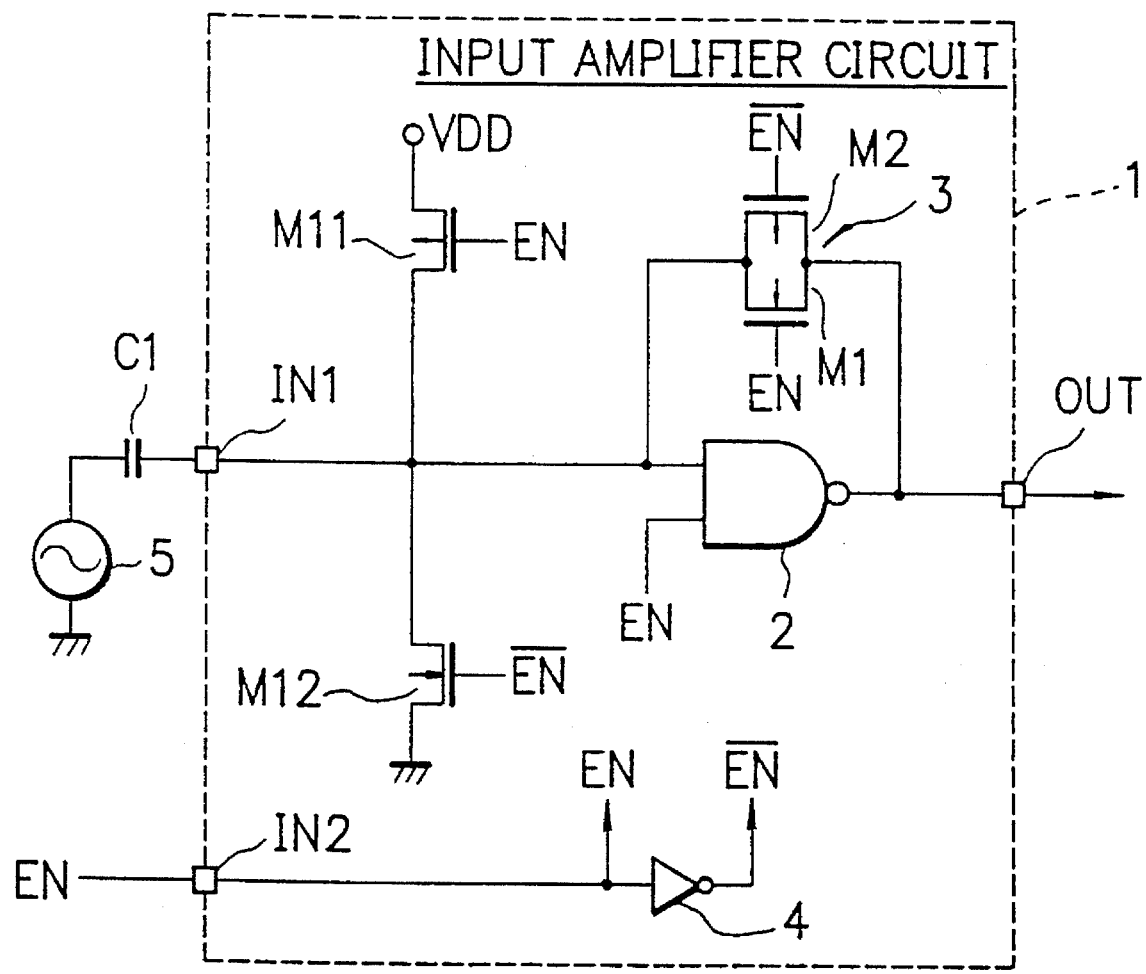
FIG. 3 is a circuit diagram of a first embodiment of an input amplifier circuit according to the present invention.

Referring now to the drawings, wherein like reference characters designate like or corresponding parts throughout the views and thus the repeated description thereof can be omitted for brevity, there is shown in FIG. 3 the first embodiment of an input amplifier circuit 1 according to the present invention.

As shown in FIG. 3, a signal source 5 is connected to an input terminal IN1 of the input amplifier circuit 1 via a capacitor C1 and the input terminal IN1 is coupled with first input terminal of a NAND circuit 2. An enable terminal IN2 is coupled with a second input terminal of the NAND circuit 2. In this case, by a control signal such as an enable signal EN, an operating state or an-inoperative state of the NAND circuit 2 can be selected. The NAND circuit 2 constituting a gate circuit for amplification is composed of a MOS transistor.

An output terminal of the NAND circuit 2 is connected to an output terminal OUT of the amplifier circuit 1 and the first input terminal of the NAND circuit 2 via a switch circuit 3 which is constituted by an N-channel MOS transistor M1 and a P-channel MOS transistor M2 so as to carry out a feedback of the output of the NAND circuit 2 to the first input terminal thereof. The enable signal EN is applied to a gate terminal of the N-channel MOS transistor M1. Also, the enable signal EN is inverted by an inverter 4 and an inverted enable signal $\overline{EN}$ is applied to a gate terminal of the P-channel MOS transistor M2.

Also, a P-channel MOS transistor M11 is connected between a DC power source VDD and the first input terminal of the NAND circuit 2 and an N-channel MOS transistor M12 is connected between the first input terminal of the NAND circuit 2 and ground. The enable-signal EN is applied to a gate terminal of the P-channel MOS transistor M11 and the inverted enable signal $\overline{EN}$ is applied to a gate terminal-of the N-channel MOS transistor M12.

In the amplifier circuit described above, since the N-channel MOS transistor M1 is controlled by the enable signal EN and the P-channel MOS transistor M2 is controlled by the inverted enable signal $\overline{EN}$, when the enable signal EN is off, that is, a low level, the switch circuit 3 composed of the N-channel MOS transistor M1 and the P-channel MOS transistor M2 is switched off and thus the first input terminal of the NAND circuit 2 is separated from the output terminal of the same.

Also, the second input terminal of the NAND circuit 2 is controlled by the enable signal EN, and, when the enable signal EN is off, the output terminal OUT is settled to the high level. Hence, in case that a CMOS gate circuit of the following stage is connected to the output terminal OUT, a standby can be executed without any unstable state and thus consumption power on and after the following stage can be reduced.

On the other hand, since the enable signal EN is applied to the gate terminal of the P-channel MOS transistor M11 connecting the DC power source VDD and the first input terminal of the NAND circuit 2 and the inverted enable signal $\overline{EN}$ is applied to the gate terminal of the N-channel MOS transistor M12 connecting the first input terminal of the NAND circuit 2 and the ground, when the enable signal EN is off, that is, the amplifier circuit 1 is in the unoperating state, both the transistors M11 and M12 are turned on and a bias voltage obtained by dividing the DC power source VDD by the MOS resistance parts of the transistors M11 and M12 is applied to the input terminal IN1.

When the enable signal EN is switched on from this state, both the transistors M11 and M12 are turned off and hence the input terminal IN1 is cut off from the DC power source VDD and the ground. As a result, the input amplifier circuit 1 changed to the operating state by the self-bias of the NAND circuit 2.

Figure 4:
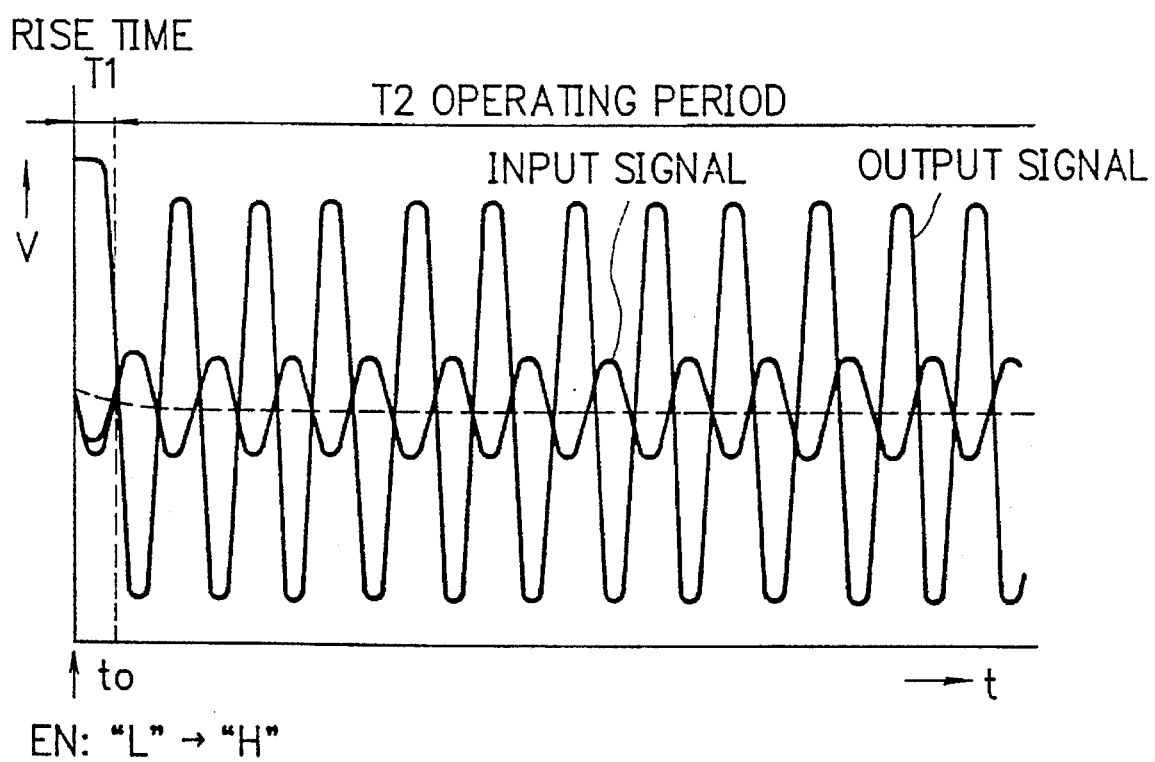
FIG. 4 is a graphical representation showing input and output waveforms for explaining an operation of the input amplifier circuit shown in FIG. 3.

As described above, in this embodiment, when the enable signal EN is switched from the low level to the high level, since the bias voltage is applied to the input terminal IN1 in advance, the input amplifier circuit 1 can be quickly raised up to the operating state without being affected by the time constant determined by the switch circuit 3 and the capacitor C1, as shown in FIG. 4.

Further, in this case, by elongating the gate length of the CMOS transistors M11 and M12 to diminish the source size, a bias current flowing in the unoperating state can be very small.

Figure 5:
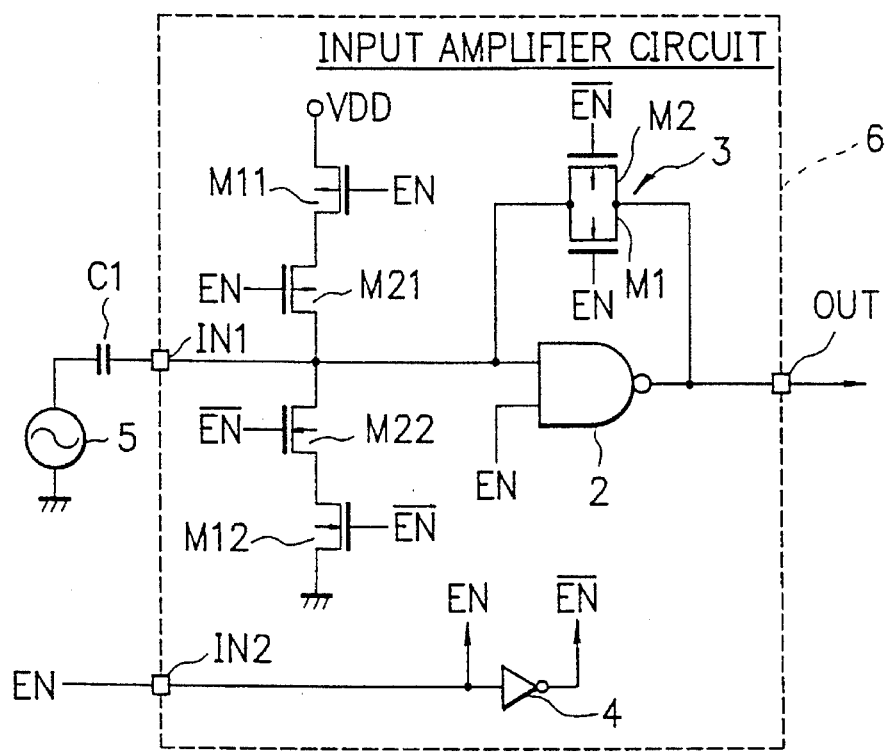
FIG. 5 is a circuit diagram of a second embodiment of an input amplifier circuit according to the present invention.

In FIG. 5, there is shown the second embodiment of an input amplifier circuit 6 according to the present invention.

In this embodiment, as shown in FIG. 5, although the drain sides of the transistors M11 and M12 are directly connected to the first input terminal of the NAND circuit 2 in the input amplifier circuit 1 shown in FIG. 3, a P-channel MOS transistor M21 and an N-channel MOS transistor M22 are further connected between the first input terminal of the NAND circuit 2 and the respective transistors M11 and M12. That is, the drain sides of the transistors M21 and M22 are connected in common to the first input terminal of the NAND circuit 2 and the sources of the transistors M21 and M22 are coupled with the DC power source VDD and the ground, respectively, via the respective transistors M11 and M12.

Further, the enable signal EN is applied to a gate terminal of the P-channel MOS transistor M21 and the inverted enable signal $\overline{EN}$ is applied to a gate terminal of the N-channel MOS transistor M22.

In this embodiment constructed as described above, the sizes of the transistors M21 and M22 are enlarged and the gate part of the first input terminal of the NAND circuit 2 can be protected from the static electricity.

Also, since the sizes of the transistors M21 and M22 are enlarged, when the enable signal EN is off, the resistance values of the transistors M21 and M22 become small. However, when the gate length of the transistors M11 and M12 is increased and the source and drain widths are reduced, these transistors M11 and M12 become high resistance in the unoperating state and the bias current flowing from the DC power source VDD to the ground can be very small.

Figure 6:
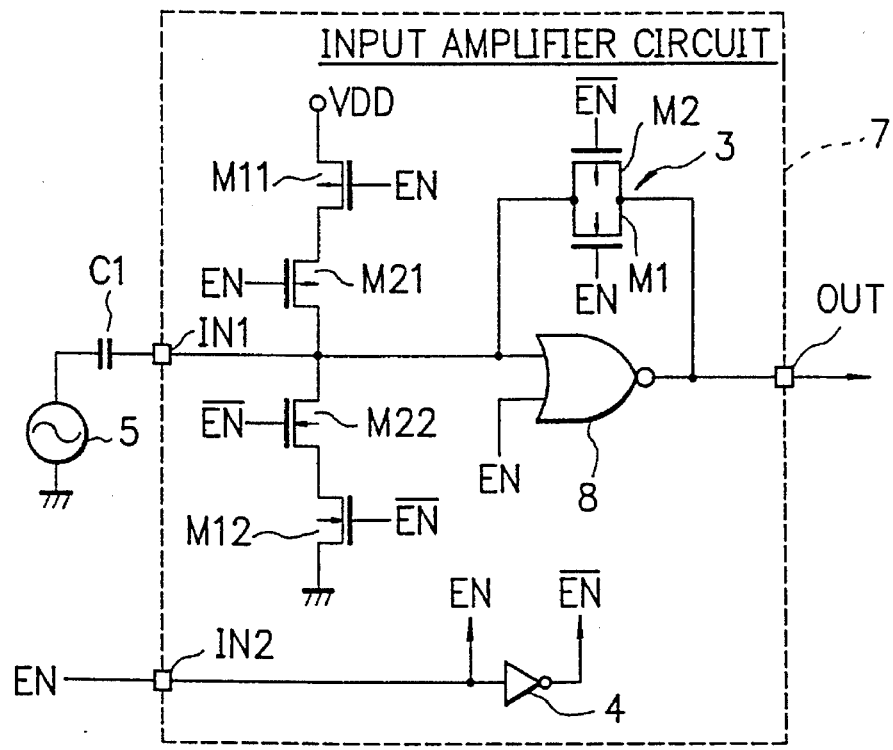
FIG. 6 is a circuit diagram of a third embodiment of an input amplifier circuit according to the present invention.

In FIG. 6, there is shown the third embodiment of an input amplifier circuit 7 according to the present invention.

In this embodiment, the input amplifier circuit 7 has the same construction as the embodiment shown in FIG. 5, except that a NOR circuit 8 having first and second input terminals is provided in place of the NAND circuit 2 and the inverted enable signal $\overline{EN}$ is applied to the second input terminal of the NOR circuit 8.

In this embodiment, the input amplifier circuit 7 is operated in the same manner as the second embodiment shown in FIG. 5, except that, when the enable signal EN is the low level, the output of the NOR circuit 8 is settled to the low level.

As described above, according to the present invention, since the bias voltage is previously applied to the input terminal in the unoperating state of the input amplifier circuit, the time required for moving up to the operating state by switching the level of the enable signal EN can be largely reduced.

According to the present invention, the signal raising up to the operating state can be quickly carried out and hence in the intermittent operation of the input amplifier circuit, the time for previously inputting the enable signal can be largely reduced. Also, an intermittent rate as a rate of the enable time to the whole period can be excellent and the consumed power can be reduced. Therefore, by using the input amplifier circuit described above for a portable telephone or the like placing great importance on a life of cell or battery, the life of the battery of devices can be largely prolonged.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An input amplifier circuit, comprising:

an amplifying gate circuit provided with a first input terminal for receiving an input signal to be amplified, a second input terminal for receiving an enable signal capable of assuming one of an OFF and an ON state, and an output terminal for providing an amplified signal, the amplifying gate circuit being selectively responsive to the enable signal to switch between an operative state and an inoperative state of said amplifying gate circuit;

a switching feedback circuit interconnected between the first input terminal and the output terminal of the amplifying gate circuit, said switching feedback circuit being controlled by the enable signal; and a combination of a first MOS transistor having a resistance value in a conductive state interconnected between a direct current power source supplying a direct current voltage and the first input terminal of the amplifying gate circuit and controlled by the enable signal, and a second MOS transistor also having said resistance value in said conductive state interconnected between the first input terminal of the amplifying gate circuit and a grounded terminal and controlled by an inverted enable signal, said enable signal, in the OFF state, enabling said first and second MOS transistors to be conductive, whereby, when the enable signal assumes the OFF state for rendering said amplifying gate circuit inoperative, the direct current voltage applied through the now ON first and second transistors is divided and applied as a bias voltage to the first input terminal of the amplifying gate circuit.

2. The input amplifier circuit claimed in claim 1, wherein:

the amplifying gate circuit comprises a NAND circuit, the NAND circuit having first NAND input terminal and second NAND input terminal and a NAND output terminal, one of an operating state and an inoperative state being selected by said enable signal input to the second NAND terminal;

the switching feedback circuit includes a resistance part, which is controlled by the enable signal and is connected between the first NAND input terminal and the NAND output terminal;

the first MOS transistor is connected between said direct current power source and the first NAND input terminal and is controlled by the enable signal; and the second MOS transistor is connected between the first NAND input terminal and ground and is controlled by the inverted enable signal.

3. The input amplifier circuit claimed in claim 1, wherein:

the amplifying gate circuit comprises a NOR circuit, the NOR circuit having a first NOR input terminal and a second NOR input terminal and an output NOR terminal, in which a signal to be amplified is input to the first NOR input terminal and one of an operating state and an inoperative state is selected by an enable signal input to the second NOR input terminal;

the switching feedback circuit including a resistance part controlled by the enable signal and connected between the first NOR input terminal and the NOR output terminal;

the first MOS transistor is connected between said direct current power source and the first NOR input terminal and is controlled by the enable signal; and the second MOS transistor is connected between the first NOR input terminal and ground and is controlled by the inverted enable signal.

4. The input amplifier circuit as claimed in claim 1, further comprising:

a combination of a third MOS transistor interconnected between the first MOS transistor and the first input terminal of the amplifying gate circuit and controlled by the enable signal, and a fourth MOS transistor interconnected between the second MOS transistor and the first input terminal of the amplifying gate circuit and controlled by the inverted enable signal;

the third MOS transistor having a larger capacitance than the first MOS transistor;

the fourth MOS transistor having a larger capacitance than the second MOS transistor; and the respective capacitances of the third and fourth MOS transistors together protecting the amplifying gate circuit from electrostatic damage.

5. The input amplifier circuit as claimed in claim 4, wherein the switching feedback circuit comprises a fifth MOS transistor controlled by the enable signal and a sixth MOS transistor controlled by the inverted enable signal.

6. The input amplifier circuit claimed in claim 1, further comprising a capacitor interconnected between the input terminal of the amplifying gate circuit and a signal source for outputting the input signal to the amplifying gate circuit.

7. The input amplifier circuit claimed in claim 1, wherein the first and second MOS transistors comprise a pair of enhancement type field effect transistors, one of which being a P-channel FET and another being an N-channel FET.

* * * * *